United States Patent

Henry et al.

[11] 4,113,899
[45] Sep. 12, 1978

[54] METHOD OF OBTAINING ELECTROLESS NICKEL COATED FILLED EPOXY RESIN ARTICLE

[75] Inventors: Russell Alger Henry, East Moline; Ernest Moreland Summers, Moline, both of Ill.

[73] Assignee: Wear-Cote International, Inc., Rock Island, Ill.

[21] Appl. No.: 799,772

[22] Filed: May 23, 1977

[51] Int. Cl.$^2$ ............................................... C23C 3/02
[52] U.S. Cl. ................................... 427/290; 427/203; 427/205; 427/305; 427/306; 427/307; 427/430 A; 427/438; 264/129; 264/232
[58] Field of Search ............... 427/305, 306, 307, 290, 427/203, 205, 430 A, 438; 428/328, 329, 418; 264/129, 232

[56] References Cited

U.S. PATENT DOCUMENTS

| | | | |
|---|---|---|---|
| 2,690,401 | 9/1954 | Gutzeit et al. | 427/306 |
| 3,226,256 | 12/1965 | Schneble, Jr. et al. | 427/306 |
| 4,059,710 | 11/1977 | Nishiyama et al. | 427/307 |

FOREIGN PATENT DOCUMENTS 962,899  2/1975  Canada .................................. 427/306

*Primary Examiner*—John D. Smith
*Attorney, Agent, or Firm*—Merchant, Gould, Smith, Edell, Welter & Schmidt

[57] ABSTRACT

Electroless nickel coating of epoxy resin foundry patterns and core boxes can be carried out without a palladium chloride/stannous chloride activation of the surface, if the pattern or core box contains a high density of metal particles which act as "keying" sites, and if the metal-filled resin surface is properly prepared. The preparation steps include a very light abrading with a fine (minus 60 U.S. mesh and preferably even finer) grit and a very brief acid pickling step. The electroless-plated article has a continuous coating of nickel bonded essentially directly to the resin through the metallic "keying" sites.

7 Claims, 4 Drawing Figures

METHOD OF OBTAINING ELECTROLESS NICKEL COATED FILLED EPOXY RESIN ARTICLE

FIELD OF THE INVENTION

The present invention relates to the preparation of surfaces of metal-filled resinous articles for electroless plating. An aspect of this invention relates to a method for electroless nickel plating which includes steps, prior to plating, for the surface preparation of a substrate which includes an electrically non-conductive matrix having metallic particles uniformly dispersed therethrough. Another aspect of this invention relates to a method for a pickling-type activation of previously provided metallic "keys" (deposition sites) for electroless nickel plating of cured resins. Still another aspect of this invention relates to an improvement upon the technology disclosed in Canadian Pat. No. 962,899 (Russell A. Henry et al), issued Feb. 18, 1975.

DESCRIPTION OF THE PRIOR ART

In the aforementioned Canadian Pat. No. 962,899, it is pointed out that electroless nickel plating processes can be applied to foundry patterns and core boxes of various types, including patterns made from more than one metal (e.g iron and aluminum) or from "other pattern materials" such as "epoxy or epoxy impregnated with metal." See page 4, lines 10-19 and page 10, lines 28-32 of the 962,899 patent.

In roughly the last two decades, an extensive amount of work has been done on the problems of metal coating (including electroless metal coating) of non-conductive substrates such as plastics or resins, filled resins (including metal-filled resins) and the like. Typically, the surface of a plastic or resinous article (filled or unfilled) is prepared for electroless plating by a process generally called "activation" or "sensitizing," which normally includes the following steps:

a. an oxidative acidic etch (e.g. a chromate- or chromic-sulfuric acid etch) which attacks the exposed resinous or plastic surface; and b. treatment of the etched plastic or resinous surface with a "catalyst", e.g. a mixture of a reducing agent such as a stannous salt and a reducible precious or noble metal salt such as palladium chloride.

There does not appear to be any clear line of agreement among researchers as to the function of the "catalyst." According to one theory, the oxidative effect of the chrome-sulfuric acid etch produces oxygen-containing organic functional groups on the resin surface, and these functional groups are capable of forming complexes with the noble metals of Group VIII of the Periodic Table, e.g. metals such as palladium. There has also been some speculation as to the possible formation of organo-tin complexes due to the presence of the stannous salt. In another theory, the metallic palladium deposited on the surface of the article is believed to provide so-called metallic "keys," i.e. electrically conductive sites for the deposition or plating of electroless metal, regardless of, or in addition to, any chemical complexing effect.

The possibility of a far simpler approach to "keying" (providing deposition sites for electroless plating) was suggested many years ago, e.g. in U.S. Pat. 2,690,401 (Gutzeit et al), issued Sept. 28, 1954; see column 4, lines 12-35 of this reference. According to this approach, a metal filler such as aluminum can provide "growth nuclei" for a nickel coating. However, severe difficulties can be encountered if one attempts to commercialize this suggestion. For example, the potential "growth nuclei" which might be provided by the aluminum filler particles may not maintain their electrical conductivity. Aluminum particles rapidly acquire a coating of non-conductive aluminum oxide when exposed to air at ordinary temperatures.

Another problem which can occur is nodular or discontinuous plating. The metal filler particles, even if suitably active of sensitive as "keys" for electroless plating, must provide a high "key" density per square unit of area. A low "key" density results in gaps in the coating, because the electroless metal plate will not bridge over between "key" sites to form a uniform, continuous layer of metal.

A high "key" density per unit area of surface can theoretically be achieved with very finely divided metallic filler particles and a high "packing factor." As is known, for example, in the art of syntactic foams, the theoretical "packing factor" for spherical particles of uniform diameter in a three-dimensional matrix is about 65% by volume. Higher "packing factors" can be achieved if spherical particles of two or more different diameters are used. In any event, at least some very finely divided metal particles should normally be used to insure high packing factors and/or high "key" density, and such particles may be small enough to be below generally recognized tolerance limits. Thus, a conventional etching step used to create a pitted surface or to remove 0.001 to 0.005 inches (about 25-125 microns) from the surface of an article may result in the complete extraction of some of the smaller metal particles from the surface of a filled resin, thereby removing or destroying some of the available "keying" sites. Indeed, some metal-filled resinous articles are treated in just this way, so that the pitted or uneven surface resulting from the extraction of metallic particles or other extractible particles will provide mechanical bonding, i.e. interlocking of the electroless metal plate and the rough surface. A different problem is posed by the larger metal particles. Even if these are not etched away or extracted (deliberately or inadvertently), they are more subject to dislodgment by conventional mechanical surface preparation steps, e.g. abrading. Furthermore, synthetic resins or plastics vary in their compatibility toward aqueous plating baths, etchants, cleaners; etc. Some resins are very hydrophobic and must be roughened, etched, or abraded to make them more wettable. Accordingly, the person skilled in the art must normally face up to the problems of mechanical dislodgment of or excessive extraction of metal filler particles.

Another troublesome property of synthetic resins is their relatively high coefficient of thermal expansion, as compared to metals such as nickel, iron, copper, etc. If the plating bath can be kept at room temperature, this problem is mitigated. However, if conventional electroless plating bath temperatures are used, the plated resinous substrate may shrink much faster than the plate during cooling, and wrinkling or loss of substrate/metal bonding can occur. In addition, the resin substrate itself should be resistant to plating bath conditions. Degradation of the resin in the plating bath (or during any pretreatment or surface preparation step) may create problems of its own.

For these and other reasons, it is believed that column 5, line 24 through column 6, line 15 of U.S. Pat. No.

3,632,704 (Coll-Palagos), issued Jan. 4, 1972, contains a disclosure which is reasonably representative of the present commercial practice relating to the plating of filled plastic or filled resinous articles. That is, the filler is ordinarily extracted out of the surface of the article, and then a "sensitizing" treatment is used (e.g. with stannous chloride and palladium chloride). Some or all of the other "sensitizing" techniques suggested in U.S. Pat. No. 3,632,704 are believed to be full of difficulties from the standpoint of commercial practice.

Accordingly, to totally dispense with the traditional stannous chloride/palladium chloride activation, it appears to be essential to avoid nonconductivity of the filler (e.g. nonconductivity due to surface oxidation or resin encapsulation), discontinuous plating, inadequate wettability of the resin, loss of "key" density (e.g. due to surface preparation or sensitizing treatments), and failure of the bond between the electroless metal plate and the filled resin substrate.

The patent and scientific literature on the application of metal plate to nonconductive substrates is so vast that it would be difficult to select a representative sampling of references. For example, the adherence of electroless metal to ABS (acrylonitrile-butadiene-styrene) plastic has been extensively studied and is the subject of dozens of research papers. Despite the extensive development of the prior art, however, a commercially practical means for solving the aforementioned problems appears to be present unavailable.

SUMMARY OF THE INVENTION

It has now been found that a cured epoxy resin article filled with finely divided metal particles can be prepared for electroless plating in a commercially practical manner without a stannous chloride/palladium chloride "activation" if (a) resin encapsulation of the metal particles at the surface of the article is removed by impingement with a suitable fine abradant, and (b) metal oxide coatings on the exposed surfaces of the resin particles are removed with an extremely brief pickling treatment. The thus-treated article can then be plated by electroless techniques in plating baths maintained at temperatures above 160° F. (above about 70° C.).

The metal particles distributed uniformly through the article should be small (in U.S. Standard mesh, $-60$ mesh and preferably $-100$ mesh), and should preferably comprise 35-85% by weight of the article to be plated. The impingement step involves the use of a more finely divided grit or abradant than normally used in the initial sandblasting of metal articles; instead of the usual $-30 +50$ or $-40 +60$ U.S. mesh sand or grit, a $-60$ or even $-100$ U.S. mesh grit is preferred. Glass beads or silica sand of this degree of fineness are of adequate hardness, and very soft abradants (e.g. those with a Moh's scale hardness less than 4.5) are ordinarily impractical. The pickling treatment should not have any significant oxidative effects, either upon the resin or plastic matrix or the metal filler of the article to be plated. Indeed, the purpose of the pickling is to remove oxide films or coatings on the exposed surfaces of the metal particles. For this purpose, hydrochloric acid (especially for iron fillers) or 7-40 wt.-% nitric acid (especially for aluminum fillers) can be used, provided the pickling treatment is sufficiently brief; best results are obtained with pickling times less than 30 seconds, although up to a minute can be used with hydrochloric acid acting on an iron filler. After pickling, the electroless nickel plating procedure described in Canadian Pat. No. 962,899, page 6, line 26 et al can be followed, so that a continuous plate with a thickness of at least 0.00025 inches (more than 5 microns) is obtained. Thicknesses of 25 to 75 microns are preferred.

BRIEF DESCRIPTION OF THE DRAWING

In the accompanying Drawing.

DETAILED DESCRIPTION

Figure 1:
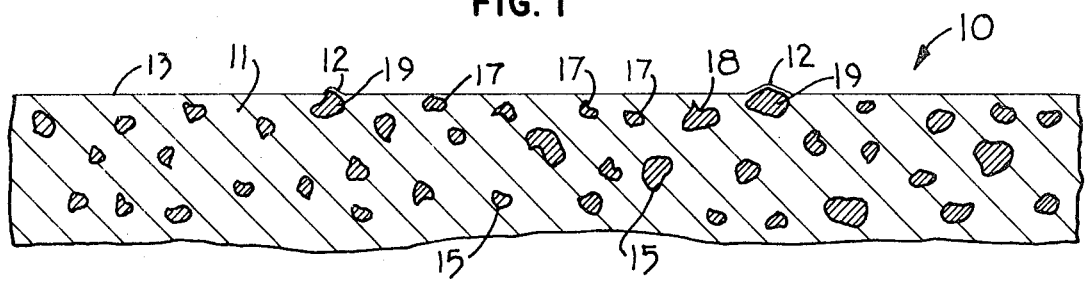
FIG. 1 represents a cross sectional view, greatly enlarged, of a small portion of the unprepared surface of a metal-filled resinous or plastic article; the number of metal filler particles per unit of cross-sectional area and the number of potential "key" sites on the exposed surface of the article is, for simplicity of illustration, shown as being far less than would be used in the actual practice of this invention.

In the description which follows, the materials and manipulative steps used in this invention will be described in detail, and references to the above-described Drawing will be made throughout the description when appropriate to a fuller understanding of these steps or materials or the surface structure of the product produced by the method.

THE FOUNDRY PATTERNS AND CORE BOXES

As is known in the art, foundry patterns and core boxes can be made from filled or unfilled cured resins. However, these articles are used to make sand molds or sand-resin models for foundry work, and even the toughest thermoset epoxy resins can be quickly worn away by the process for forming the sand mold or sand mold element from the pattern. Furthermore, the resins (e.g. polyurethanes) used as binders in some sand molds leave deposits on the surface of the pattern or core box which are difficult to remove without using organic solvents. It is also known that a layer of nickel plate on the surface of the pattern or core box provides much greater durability and easier clean-up (e.g. easier removal of the deposits of urethane binder). Many other advantages of nickel plating of foundry patterns are described in the afore-mentioned Canadian Pat. No. 962,889.

In the case of foundry patterns and core boxes made from moldable and curable resins, the coating with nickel plate takes on a particularly great significance. There are many intricate patterns for foundry sand molds which can be made much more easily and cheaply with epoxy resins as opposed to metals, but metals are often preferred for durability. The nickel plate can serve as the equalizer which will make resinous patterns and core boxes more competitive in performance with metal ones. Furthermore, epoxy resin materials can be used to patch, repair, or alter the contours of metal foundry patterns and core boxes, and such uses of epoxies are more practical and effective if an electroless nickel coating could be plated onto the entire pattern or its resinous (repaired or altered) portion.

Perhaps one of the most promising uses of epoxy materials in the fabrication of foundry patterns and core boxes is the "surface coat" technique. In this technique, a master is coated with a release agent, and one or more layers of the uncured "surface coat" epoxy resin are applied to the master and partially cured. Prior to the surface coat completely curing it can be bonded to and backed up with high-strength substrata, using common laminating materials and procedures, and the resulting laminate is removed from the master. Since the application of the surface coat to the master is somewhat analogous to painting, the viscosity and thixotropy (false body or shear-dependent viscosity) of the surface coat material (prior to curing) should be high enough to prevent excessive sagging, but low enough to permit good flow and application properties.

For repairing or altering the contours of a previously fabricated pattern or core box, the uncured epoxy patch material should be much more viscous and thixotropic. In most cases, the patch material is applied in much greater thicknesses than the surface coat material.

An entire pattern or core box can be formed from a moldable, curable epoxy resin. This technique is analogous to the casting or molding of a plastic part and is most useful in the fabrication of relatively small foundry patterns.

Although these techniques of using epoxies and metal-filled epoxies have had some commercial success, even without electroless nickel coating, the coating of nickel greatly expands the areas of commercial utility. As is known in the art of plating foundry patterns, it is not always necessary or even desirable to coat the entire pattern surface, however. In these situations, the areas which are to be free of nickel plate are masked off in a conventional manner.

Curable (thermosettable), moldable epoxy resins appear to be the best candidates for "surface coat" and patch materials. The vicinal (1,2-) aliphatic, cycloaliphatic, and aromatic epoxides having an epoxy equivalent weight in excess of about 75 are capable of being cured or hardened to high strength materials with good resistance to chemical attack. The terminology used to describe curable epoxy systems is often inconsistent and sometimes confusing. The uncured epoxy monomer or prepolymer is often called the "resin," even though the cured or hardened or thermoset material is also a synthetic organic resin. The co-reactant or curative or curing agent is sometimes called the "hardener," but is occasionally misnamed the "catalyst". In the practice of this invention, liquid "resins" are preferred, since these are more easily provided with a uniformly distributed particulate metal filler. The preferred hardeners contain active hydrogen, e.g. terminal primary or secondary amine groups which are reactive with vicinal epoxide (oxirane) rings at normal ambient temperatures.

Although various stable one-part epoxy systems are known, these systems ordinarily require a step such as heating or the addition of an initiator to activate the hardening or curing or crosslinking reactions. Accordingly, two-part room temperature-curable systems are ordinarily as convenient to use in pattern making as the one-part or latent-curable systems. In making patterns and core boxes which can be nickel plated according to this invention, the metal filler can be included entirely in part B (the hardener part), but it is ordinarily preferred to include all or a major amount of the metal filler in part A (the "resin" part).

It is also preferred that both parts A and B be substantially free of volatile solvents and diluents and thus be 100% "solids" systems. By 100% "solids" is meant that, after curing of the combined part A/part B mixture, there will essentially be no volatile liquid residue; all components or ingredients of both parts will be solid at the outset or will have been reacted into the cured, thermoset resin molecule.

EPOXY RESINS

For low cost and ready availability, the aromatic or aliphatic epoxy "resins" are preferred, e.g. the polyglycidyl ethers with an epoxy equivalent weight (EEW) above 100 or, more typically, above 150. Among these are the diglycidyl ethers of bisphenol A, which generally range from about 190 to about 2000 in epoxy equivalent weight (EEW), depending upon the number of repeating units in the uncured "resin." Since liquid "resins" are preferred, EEW's of less than 1000 would normally be selected.

HARDENERS

The preferred hardeners are of the amine type. These hardeners can, for example, be terminated with primary or secondary amine groups, both of which have available active hydrogen as well as an available electron pair bond for interaction with the 1,2-epoxy (oxirane) ring. The amines are preferably polyfunctional and can be in a low stage of polymerization; alternatively, the amines can be adducts which have been pre-reacted with a small amount of epoxide so as to increase their molecular weight and/or equivalent weight without completely sacrificing the terminal and/or pendent amine functionality. (In the case of the epoxy "resins,"- pre-reacted adducts can also be used to increase the EEW). Aliphatic, cycloaliphatic, aromatic, and polyamido polyfunctional amines are commercially available and have been used in the hardening of epoxy resins. The aromatic amines tend to react much slower than the aliphatic amines, thus detracting from the convenience — particularly important to the pattern maker — of reasonably rapid cures at normal ambient or moderately elevated temperatures, e.g. temperatures up to about 150° F. (about 65° C.). Some polyamido polyamines provide rapid room temperature cures; however, the resulting cured epoxy resins may lack sufficient resistance to attack by the conditions prevailing in the electroless nickel plating bath or the oxide-removing pickling treatment. Accordingly, aliphatic amines normally provide the best balance of properties in the cured resin.

There are a variety of aliphatic amine hardeners which are low viscosity liquids and which provide reasonably rapid cures at temperatures below 65° C., e.g. cures in less than a few days or, preferably, less than 60 hours. In this context, the term "cure" is used to mean increases in the molecular weight of the resin system, primarily due to crosslinking, thereby providing a thermoset material. Thus, the amine hardener is selected with a view toward an amine equivalent weight and an amine functionality which will provide a sufficient degree of crosslinking (thermoset character) such that the metal-filled cured resin articles will be resistant to chemical and/or thermal attack during pickling and electroless nickel plating. A further purpose for the desired thermoset character is to keep within bounds, if possible, the coefficient of thermal expansion (CTE). It is not unusual for the CTE of a cured epoxy material to be greater than the CTE of metallic nickel by a factor of 10 or 20 or more. In any event, the important consideration is a comparison of the CTE values in the 70°–95°

C. range. A cured epoxy material which goes through a phase change above 70° C. and thereby goes to a higher CTE is likely to be unsuitable for use in the present invention.

Excellent physical and chemical properties for the cured epoxy resin can be obtained with a so-called "postbake" step, but it is ordinarily preferred to select hardeners and epoxy resins which will avoid the need for such a step.

Amine equivalent weights of hardeners selected according to this invention are generally above 30 and can be much higher than this. For example, monomeric difunctional aliphatic amines having an amine equivalent weight in excess of 75 are readily available.

If an aliphatic amine is too slow in curing the epoxy resin, but is otherwise suitable, modifications of the epoxy resin itself can be used to speed up the rate of cure. For example, as is known in the art, the substitution of methylol groups on the epoxy resin molecule results in a "resin" with a faster cure rate.

The principal reason for selecting a hardener which will provide a cured resin with a low CTE is to avoid the problem of buckling or delamination of the electroless nickel coating while the cured and plated article is cooling down to normal ambient temperature from the 70°–95° C. temperature of the electroless nickel plating bath. Accordingly, it is preferred to use a resin/hardener system with a CTE which is less than about 15 times the CTE of metallic nickel. CTE values which differ by less than a factor of 10 are even more advantageous in that they further reduce the need for a slow cool-down cycle after plating. The ideal, of course, is to eliminate the need for any controlled cool-down cycle.

The resistance to thermal degradation in the cured resin system is particularly important in the context of this invention, since the electroless plating cycle normally lasts a minimum of 1 or 2 hours and can even last for as much as 24 hours, depending upon the thickness of nickel plate desired. For typical plating thicknesses (e.g. about 25 microns or 1 mil), the residence time in the plating bath is likely to be about 3 to 12 hours.

Equivalent weight ratios of resin to hardener are generally selected to be within a few percent (e.g. 10%) of stoichiometry. Indeed, precise 1:1 stoichiometry (from an equivalent weight standpoint) is preferred. Although it is also desirable for the pattern maker that the resin/hardener ratio be 1:1 from either a weight/weight or volume/volume standpoint, this result is extremely difficult to achieve in practice. Not only is it likely that the resin and hardener may differ in equivalent weight, it should also be remembered that the resin part (part A) and the hardener part (part B) can contain many other materials besides the resin or hardener itself. Foremost among these is the particulate metal filler, which will ordinarily be contained primarily or entirely in part A. As a result, the resin/hardener ratio by volume can be greater than 1:1 (e.g. up to 10 or 15:1). A similar range of resin/hardener ratios can occur on a weight/weight basis.

The other ingredients of the resin and hardener compositions will now be described in detail.

METAL FILLERS

The preferred metal fillers are particulate iron and/or particulate aluminum. Other metallic particles suitable for use as fillers include powdered brass, copper, and nickel, all of which tend to be HCl-resistant. Gold, silver, and the noble metals (i.e. the platinum group) are technically operative but relatively costly and sometimes difficult to obtain. Group IV metals and transition metals which are less electropositive than zinc can be selected for the appropriate degree of acid resistance and "keying" ability. For example, tin reacts rather slowly with cold HCl and does not oxidize easily in air. These fillers should be in a state of fine subdivision, ranging from pigment grades up to about 60 U.S. mesh. Pigment grade materials are normally minus 100 or even minus 200 mesh, and the finest of pigments are not retained even on a 325 mesh screen. Very high "packing factors" can be obtained when the metallic filler varies in size, e.g. from a few microns or less up to several hundred microns. To further maximize the packing factor, it is desirable to use a plurality of fairly distinct size fractions, so that tiny metal particles can fit into the interstices between the large particles.

When the metal filler particles are uniformly distributed (i.e. uniformly dispersed or suspended) throughout the uncured epoxy system, which is preferably a viscous liquid, a high density of metallic particles will be present at the surface of the resulting cured resin article, particularly when filler loadings are selected according to the principles of this invention. However, to be effective in the context of this invention, these filler particles should be exposed to the atmosphere, so that they will also be exposed to the chemicals in the electroless nickel plating bath. Exposure to the atmosphere results in rapid formation of metallic oxides — in some instances a film of oxide only a few molecules thick. Nevertheless, this oxide formation interferes with the "keying" effect of the particles. As will be explained subsequently, an important objective of this invention is to remove the oxide film or coating and thereby activate the metallic "keys."

THIXOTROPES AND SUSPENDING AGENTS

In this invention, it is preferred to use liquid "resin" and hardener components which can be thickened, rather than solid or semi-solid resins. A wide variety of organic and inorganic thixotropes and suspending agents can be used to keep the metal filler particles uniformly distributed through the resin and hardener and also to provide the desired high level of viscosity and thixotropy. For example, colloidal silica is known to have the ability to impart both thickening and thixotropy to liquid curable epoxy resin systems. Organic thickeners (e.g. of the "THIXCIN" type) are also known. Inorganic thickeners such as asbestos and bentonite can be made more efficient with surface treatments. An example of a treated asbestos is "CALIDRIA" (trademark), and the "BENTONES" (trademark of National Lead Company) are amine-treated bentonites with both thixotropy and thickening properties. Hydrated alumina can be used to assist in keeping the metal filler particles in suspension. Relatively small amounts of these thixotropes and suspending agents are ordinarily sufficient.

OTHER INGREDIENTS

In addition to the metal filler particles, thixotropes, and suspending agents, the resin and/or the hardener can contain a variety of other useful ingredients including phenolic accelerators, pigments, extenders, reinforcing agents, sulfonamides, and non-metallic inorganic fillers (e.g. calcium carbonate, barium sulfate, etc.). In addition, either or both of part A and part B can contain plasticizers for viscosity reduction, anti-blushing compositions, and agents for reducing the effect of humidity upon the cure rate. The phenolic accelerator and the sulfonamide, if used, are ordinarily included in the hardener part (part B).

Still additional ingredients may be included but are optional and sometimes even undesirable. For example, volatile solvents or diluents can detract from the effectiveness of the epoxy resin/hardener system by increasing the likelihood that a volatile material may be driven out during electroless plating, thus causing bubbles or blisters in the coating of nickel plate. As noted previously, 100% solids materials are preferred. True catalysts (such as imidazole) can be included to speed up the cure rate, but such additives are ordinarily not preferred.

With respect to the inorganic fillers or extenders, it is not necessary that they be leachable or acid-soluble. Thus, calcium carbonate is not a preferred filler. It has been found that mechanical roughening of the substrate with fine grit is more controllable than chemical etching and/or leaching of soluble fillers at the surface; hence the preferred epoxy/hardener systems contain no leachable nonmetallic inorganic fillers, and leaching of the metallic filler is avoided.

Commercially available metal-filled epoxy resin and hardener systems can be used in this invention, e.g. surface coats and casting compounds.

PROPORTIONS

The curable epoxy resin systems typically used in this invention are most often prepared in two parts, an A ("resin") part and a B (hardener) part. A typical part A contains 20–60% by weight of curable aliphatic polyepoxide, up to 90% (e.g. 10–85 weight-%) metallic filler, 0–15 weight-% of a thixotropic agent (preferably 3–10 weight-%), 0–20 weight-% of an anti-setting agent (preferably 3–15 weight-%), 0–20% by weight of an inorganic fibrous reinforcing agent, and 0–20 weight-% of nonmetallic inorganic fillers, pigments, and extenders such as barium sulfate. If the amount of metallic filler is at the low end of the range (e.g. 10 weight-%), then the hardener component (part B) should contain enough metallic filler to bring the total metal content of the entire system up to at least about 25%, preferably 45% by weight. If the part A is to be used as part of a surface coat or patch material, it will preferably contain at least about 0.5 weight-% of the thixotropic agent.

A typical part B contains 15–100% by weight of amine hardener, 0–15 weight-% thixotropic agent (preferably 2–10 weight-%), 0–20 weight-% of anti-setting agent (preferably 3–15 weight-%), 0–30 weight-% phenolic accelerator (preferably 5–25 weight-%), 0–25 weight-% of an anti-blushing agent (an agent for mitigating the effects of ambient humidity on the system), and 0–35 weight-% of nonmetallic fillers, pigments, extenders, reinforcing agents, etc.

When the two parts (A and B) are mixed and cured, the resulting cured resin article normally contains 15–65 weight-% cured resin (the resin/hardener reaction product), 35–85 weight-% metal filler particles, and the balance, up to about 60 weight-% (but ordinarily not more than 30 weight-%) of the aforementioned ingredients such as thixotropes, nonmetallic fillers, anti-setting agents, etc.

ABRADANT

Preferred abradants should be suitable for use in sandblasting or other impingement techniques and should have a Moh's scale hardness in excess of 4.5. Thus, ordinary sandblasting grades of silica sand have adequate hardness. However, the usual −30 +50 U.S. mesh sandblasting sand is too coarse to prepare the surface of articles plated according to this invention. The coarse sand tends to dislodge metal particles on the surface of the article. Even if such dislodgement affects only a portion of these exposed particles, the reduction in "keying" sites may be sufficient to prevent formation of a smooth continuous coating of electroless nickel during the plating step. Accordingly, the inert particles used in the abrading step should pass a 60 mesh screen and preferably a 100 U.S. mesh screen also.

In the art of sandblasting, it is a common practice to obtain finer sandblasting grit by starting with the conventional 30–50 mesh sand, using it and re-using it in a particular sandblasting booth, and then collecting the shattered sand particles for use in fine or delicate abrading jobs. In the present invention, however, it is ordinarily preferred to obtain a finer grit at the outset. The use and re-use of coarse grit to break it down into finer particles is considered a poorly controlled approach to the delicate abrading problems of this invention.

SOLUTIONS AND BATHS USED IN SURFACE PREPARATION

Although conventional cleaning baths, zincating baths, and the like are preferably used for articles plated according to this invention (the zincating baths are particularly useful if any aluminum is present), it is generally an objective of this invention to avoid oxidative treatments of the metal/resin articles and "catalyst" treatments, particularly of the palladium salt/stannous salt type. Nevertheless, some sort of acid dip is needed to remove any oxide on the exposed surfaces of the metal particles on the surface of the substrate. For iron particles (i.e. iron-filled resinous articles), 10–30% by weight aqueous hydrochloric acid (preferably about 15–25% by weight) provides a suitable acid dip for removal of surface oxide, provided that the dipping time is kept short, e.g. less than a minute. Aluminum-filled articles must be treated with somewhat greater care when the surface oxide on the aluminum is removed. It has been found that the standard 42 Baume nitric acid (which is about 67% $HNO_3$ and the balance water) can provide a suitable 1–15 second acid dip, provided that the 42 Baume acid is diluted to 10–50% by volume with water. At the 10% concentration level, the resulting dilute acid will contain at least about 7% by weight of $HNO_3$, and at the higher concentrations, there will be about 35 or 40% by weight of $HNO_3$. The more dilute concentrations are less effective in removing the oxide; hence, concentrations of nitric acid in excess of 20% by weight are ordinarily preferred. When the nitric acid concentration exceeds about 40% by weight, however, there may be some chemical attack upon the resin matrix of the article, even during a dip time of only a few seconds. Since nitric acid is an oxidizing agent, such chemical attack should be avoided.

As is known in the art, there are other alternatives for controlling the rate of attack of nitric acid upon metals, plastics, and the like. For example, highly concentrated nitric acid is sometimes used on the theory that there will be insufficient solvent (water) to permit the normal degree of dissociation of the acid into solvated protons and nitrate anions. In another approach sometimes used in the art, the concentrated nitric acid is combined with hydrofluoric acid and/or other inorganic or organic acids to control the rate of attack. This technique has been used for a variety of metals besides aluminum. It is known, for example, that Merica's solution is very good for the treatment of cast, cold drawn, and annealed nickel. If any of these mixed acid baths are used, it is ordinarily preferred to combine concentrated nitric acid with one or more relatively weaker acids, e.g. organic or inorganic acids with a $pK_a$ greater than 2. For polybasic acids, the $pK_1$ should be greater than 2. The preferred organic acids are the liquid carboxylic acids which are soluble in nitric acid.

For a description of suitable electroless nickel baths, cleaning baths, zincate baths, and the like, see the aforementioned Canadian Pat. No. 962,899, the pertinent portions of which are incorporated herein by reference, e.g. pages 5-7 of that patent. Thus, the typical electroless nickel solutions used in this invention will contain nickel sulfate (or an equivalent nickel salt) and a reducing agent such as sodium hypophosphite dissolved in water. Other reducing agents have been used commercially, e.g. boron compounds. Initial operating temperatures of the bath are preferably above 160° F., and the bath temperature increases upon aging, e.g. up to about 200° F.

THE METHOD

The method of this invention is best understood with reference to the accompanying Drawing.

FIG. 1 is a greatly enlarged and greatly simplified illustration of a portion of the surface of a metal-filled resin article prior to abrading, removal of oxide with acid, and electroless nickel plating. The article comprises a cured epoxy resin matrix 11 with metal particles distributed through matrix 11 in a generally uniform manner. Some of the metal particles, e.g. particles 15 are too far removed from the surface 13 of matrix 11 to be useful as "keying" sites. However, it would be inconvenient to formulate an article with only metal particles at or just below the surface. Accordingly, there is believed to be no particular advantage in attempting to avoid the presence of particles such as particles 15 which are too remote from the surface 13 to be affected by or useful in the subsequent steps of the method. Closer to the surface 13 of the matrix 11, it will be noted that the surface or near-surface particles 17, 18, and 19 differ in size. These size differences can be useful when extremely high packing factors are desired. It should also be noted that no metal particles shown in FIG. 1 are actually fully exposed. Those near the surface, such as particles 17 and 18 are still completely encapsulated by resin matrix 11. Those at the surface, such as particle 19, may still have a very thin coating of resin matrix, i.e. coating 12 over their uppermost surface, thereby resulting in encapsulation of these particles also. Thus, the portion of article 10 shown in FIG. 1 should be treated to expose metal particles 17 and 18, thereby increasing the number of "keying" sites, and the resinous coating 12 on particles 19 should be removed to render them more active.

Figure 2:
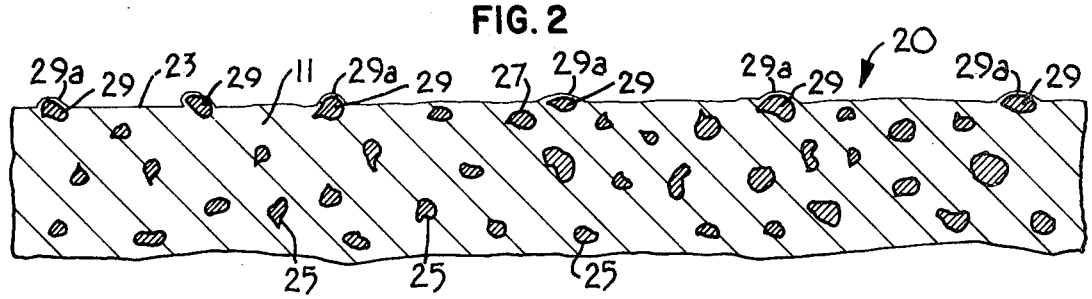
FIG. 2 represents a cross sectional view, greatly enlarged, of a small portion of the surface of the metal-filled resinous or plastic article after impingement with a suitable abradant.

FIG. 2 shows how article 10 has been lightly abraded to provide the higher density of "keying" sites of article 20. As before, there are still a multitude of metal particles 25 which are too remote from the exposed surface 23 to be useful in or affected by subsequent steps of the process. There are also still some particles 27 which have not been exposed by the light abrading (i.e. the impingement technique described previously). Most important, however, the large number of potential "keying" sites 29 are still unsuitable for use in the process and must be further treated. Particles 29, which comprise iron or aluminum, have acquired extremely thin oxide coatings or films 29a, due to the exposure of particles 29 to the atmosphere. (In the case of aluminum particles, this oxide film forms in a matter of seconds.) Even if oxide film 29a is only a few molecules thick, it can still cause particle 29 to behave as if it were electrically non-conductive, since aluminum oxide and some iron oxides are excellent electrical insulators. Accordingly, oxide films 29a must be removed. Note that, at this point, resin matrix 11 has still not been subjected to any significant chemical treatment (other than any cleaning or degreasing which may be desirable to provide a clean surface). The principal treatment of article 20, to this point, has been light mechanical abrading; hence, surface 23 of the resin matrix 11 is generally free of the type of oxygen-containing functional groups which can result from a chrome-sulfuric acid etch.

Figure 3:
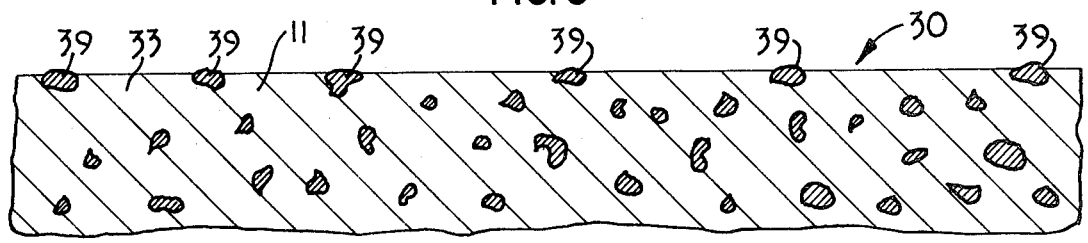
FIG. 3 represents a view similar to FIG. 2 after the pickling treatment of the surface.

In FIG. 3, the article (designated 30 to distinguish it from the abraded but otherwise relatively untreated article 20) has been subjected to a very brief acid pickling treatment for the purpose of removing the aforementioned oxide films. The duration of the pickling treatment is extremely important. For hydrochloric acid treatment of metal particles at the surface 23 of article 20, a pickling time of up to about a minute is permissible, but pickling times less than 30 seconds are preferred. (The preferred method of pickling is to dip the article into an acid bath.) Excessive pickling times could result in an attack upon the surface 33 of resin matrix 11, which is ordinarily not desired.

In the case of aluminum particles, the pickling treatment is preferably even shorter, e.g. less than 20 seconds and in most cases not longer than 30 seconds. As noted previously, a 1-15 second dip in an appropriate nitric acid solution can be sufficient.

Not only is it important to control the attack of the acid upon resin matrix 11, it is also important to control the attack upon metal particles 29 (FIG. 2). The abrading treatment described previously can have the desirable effect of burnishing metal particles 29, so that they flatten out to some degree, increasing the area of metal which will ultimately be exposed to the plating bath. It is desirable that the exposure to acid pickling be controlled such that the broadened out areas of the particles are not dissolved away or converted to metal salts (chhorides or nitrates). It should also be remembered that the metal particles 29 and 39 can be as small as a few microns in diameter, and excessive pickling times could actually extract the particles completely. Such extraction would be undesirable, since it would reduce the number of "keying" sites, and, as noted previously, even a reduction in the size of each "keying" site should be avoided, if possible.

It has been found to be much easier to control the time of the pickling cycle or dip rather than the intensity of the attack. As noted previously, some control over the intensity of attack can be obtained by manipulating acid concentrations and other ingredients of the pickling solution or bath. However, for the ordinary electroless plating operation, where baths are formulated for long term use and then re-used as much as possible, the time factor is generally the easiest to manipulate.

It is believed to be surprising that a short pickling treatment, short enough to avoid excess attack upon the resin matrix 11 or metal particle 29 is nevertheless sufficient to strip off oxide films 29a. Careful fine tuning of the pickling time factor is, of course, not new per se in the art of electroless plating. However, most of the experience with pickling relates to solid metal surfaces, which would not necessarily be expected to behave in a manner analogous to a metal-filled resin surface.

Figure 4:
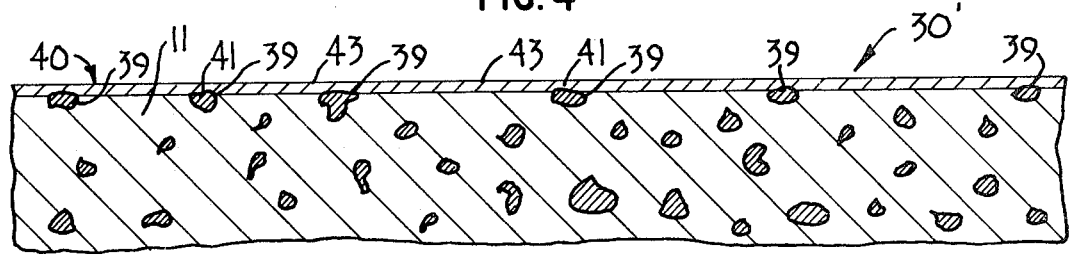
FIG. 4 represents a view similar to FIGS. 2 and 3, but after electroless plating.

The oxide-free surfaces of metal particles 39 of article 30 are now substantially ready for electroless plating. Surprisingly, the usual conventional preparatory procedures (rinsing, zincating, and the like) also work in the desired manner, despite the fact that it is a metal-filled resinous article being treated rather than a purely metallic substrate. FIG. 4 shows the nickel plated article 30' which emerges from the electroless plating bath. A continuous layer of electroless nickel 40 is securely bonded to resin matrix 11 through the large number of "keying" sites provided by metal particles 39. It is believed that metal particles 39 serve as growth or nucleation sites for the deposition of electroless nickel. However, the deposition of nickel is not limited to areas 41 which are immediately above and adjacent particles 39. Bridging over between deposition sites 41 is obtained in areas 43. In other words, it is believed that the first electroless nickel deposits may be discontinuous or nodular in nature and generally confined to areas 41; however, these areas grow and bridge over between growth or nucleation sites, so that a continuous metal plate 40 is obtained. This is also believed to be surprising in view of the fact that the only bonding between plate 40 and the surface of resin matrix 11 in areas 43 is probably mechanical in nature (resulting from the roughness in the surface of matrix 11 remaining after the abrading step). Thus, it is also believed that there are no oxygen-containing functional groups complexed with the nickel, organo-metallic chemical bonds, or the like holding plate 40 to the surface of resin matrix 11. Nevertheless, excellent peel strengths are obtained, and the metal/resin bond is very adequate for the purpose of plating foundry patterns and core boxes.

It should be understood that the foregoing discussion of the growth of metal layer 40 and the bonding of this layer to "keying" sites 39 and resin matrix 11 is theoretical only, and this invention is not intended to be bound by any theory. A precise determination of the mechanisms for forming plate 40 and causing it to bond securely to metal particles 39 and resin matrix 11 is difficult and perhaps even impossible to obtain, given the present state of the art. As noted previously, there is still considerable debate between experts as to the mechanism by which the prior art palladium chloride/stannous chloride catalytic activation provides improved bonding of metal to plastics.

The following non-limiting Examples are illustrative of the principle and practice of this invention.

EXAMPLE 1

A suitable metal-filled resin article was prepared by casting of the following composition.

| | |
|---|---|
| High performance, aluminum-filled, machinable epoxy resin casting compound ("HYSOL" TE 4351) | 100 parts by weight |
| Low viscosity, general purpose hardener for TE 4351 ("HYSOL" HD 0111, trade designation of the Dexter Corporation) | 10 parts by weight |

The resin (TE 4351) had a viscosity of 65,000 centipoise (cps). It was mixed in the above-described ratio with the hardener, cured for 12 hours at 72° F. and then "postbaked" for two hours at 300° F. to provide more thermoset character. It was found that the resulting article, after abrading, could be exposed to 42 Baume nitric acid, which had been diluted 1:1 by volume with water, for 5 to 10 seconds without excessive attack upon the cured resin or the metal particles at the surface. When excessively long acid pickling treatments were used, the resin changed color, indicating that some significant chemical attack upon it had occurred.

Typical cured properties of the 100:10 TE 4351/HD 0111 combination are as follows.

| | |
|---|---|
| Specific gravity: | 1.66 g/cm$^3$ |
| Shrinkage, inch/inch: | 0.004 |
| Hardness, Shore D: | 85 |
| Exotherm, 1 pound mass degree F.: | 150 |
| Compressive strength, psi: | 16,000 |
| Flexural strength, psi: | 6,000 |
| Tensile strength, psi: | 9,500 |
| Modulus of elasticity: | 0.5 × 10$^6$ |
| Service temperature, degrees F.: | 175 (continuous) or 220 (intermittent) |
| Coefficient of thermal expansion: | 55 × 10$^{-6}$ |

EXAMPLES 2 and 3

The procedures described in Example 1 and the foregoing specification were used to prepare the surfaces of rsin articles made from the following compositions. The Example 2 composition is an aluminum-filled surface coat material, and the Example 3 composition is an iron-filled patch material.* Abrading was carried out by sandblasting; the acid pickling of the aluminum-filled article was done with nitric acid, while hydrochloric acid was used for the iron filled article.

*Both were experimental materials obtained from REN Plastics (a CIBA-GEIGY company) of Lansing, Michigan, U.S.A.

| | AMOUNT IN PARTS BY WEIGHT | |
|---|---|---|
| INGREDIENTS | Example 2 | Example 3 |
| Part A; Resin Component | | |
| Liquid epoxy resin (Bisphenol A type), 100% solids | 45 | 20 |
| Aluminum powder, −200 mesh | 50 | — |
| Iron powder, −200 mesh | — | 75 |
| Hydrated alumina | 5 | — |
| Thioxotrope | — | 0.5 |
| Inorganic filler | — | 4.5 |
| Part B: Hardener Component | | |
| Aliphatic amine | 53 | 70 |
| Phenolic accelerator | 20 | — |
| Thioxotrope | 7 | 8 |
| Sulfonamide | 20 | 22 |
| PART A/PART B RATIOS | | |
| By volume | 9:1 | 5:1 |
| By weight | 100:16 | 100:7 |

What is claimed is:

1. In a method for the electroless nickel coating of an article comprising, on the surface of said article, a cured epoxy resin matrix containing generally minus 60 mesh metal filler particles uniformly distributed through said matrix, said article being selected from the group consisting of foundry patterns and core boxes, which method utilizes only said metal filler particles as sites for electroless nickel deposition and does not involve activation of the resin surface and the metal filler particles with oxidation and a catalytic treatment to provide such sites, the improvement which comprises the following steps:
   (a) impinging the surface of a said article with inert particles, having a Moh's scale hardness in excess of 4.5 and a U.S. Standard mesh size such that a major amount by weight of said particles will pass a 60 mesh screen, thereby increasing the number of metal filler particles at the surface of said article which are exposed to the atmosphere and free of any coating of or encapsulation with cured resin;
   (b) removing any metal oxide film on the exposed surfaces of the exposed metal filler particles by contacting said exposed surfaces with nitric acid for a period of time, less than about 1 minute, sufficient to remove said metal oxide film but insufficient to oxidatively attack said cured epoxy resin matrix; and
   (c) immersing the said article treated according to steps (a) and (b) in an electroless nickel plating bath maintained at a temperature ranging from about 160° to 210° F. until initial metallic nickel deposits form on the oxide-free surfaces of said exposed metal filler particles and sufficient additional metallic nickel deposits to bridge over between said initial metallic nickel deposits to form a continuous electroless nickel coating on said article, which coating has a thickness of at least about 5 microns.

2. A method according to claim 1 wherein said metal filler particles comprise aluminum particles.

3. A method according to claim 1 wherein said article comprises:
   15–65% by weight of a matrix comprising the normal ambient temperature-cured reaction product of the generally solvent-free components comprising a diglycidyl ether of bisphenol A and a generally stoichiometric amount of an amine hardener for said diglycidyl ether of bisphenol A, which hardener is reactive with epoxide groups at normal ambient temperatures, said reaction product being resistant to attack by nitric acid for at least 30 seconds at temperatures below 200° F.; said matrix having a coefficient of thermal expansion, determined at an average temperature of 170° F., which is less than 10 times the coefficient of thermal expansion of metallic nickel;
   35–85% by weight of aluminum particles distributed uniformly through said matrix, said particles being generally minus 100 U.S. Standard mesh in size.

4. A method according to claim 3 wherein the said metal filler particles comprise at least two particulate components which differ from each other in average particle size.

5. A method according to claim 1 wherein:
   said metal filler particles comprise aluminum; and
   said step (b) comprises immersing said article in a nitric acid-containing bath for less than 30 seconds.

6. In a method for the electroless nickel coating of an article comprising, on the surface of said article, a cured epoxy resin matrix containing generally minus 60 mesh iron filler particles uniformly distributed through said matrix, said article being selected from the group consisting of foundry patterns and core boxes, which method utilizes only said iron filler particles as sites for electroless nickel deposition and does not involve activation of the resin surface and the metal particles with oxidation and a catalytic treatment to provide such sites, the improvement which comprises the following steps:
   (a) impinging the surface of a said article with inert particles, having a Moh's scale hardness in excess of 4.5 and a U.S. Standard mesh size such that a major amount by weight of said particles will pass a 60 mesh screen, thereby increasing the number of iron filler particles at the surface of said article which are exposed to the atmosphere and free of any coating of or encapsulation with cured resin;
   (b) removing any iron oxide film on the exposed surfaces of the exposed metal particles by contacting said exposed surfaces with hydrochloric acid for a period of time, less than about one minute, sufficient to remove said iron oxide film, but insufficient to chemically attack said cured epoxy resin matrix; and
   (c) immersing the said article treated according to steps (a) and (b) in an electroless nickel plating bath maintained at a temperature ranging from about 160° to 210° F. until initial metallic nickel deposits form on the oxide-free surfaces of said exposed iron filler particles and sufficient additional metallic nickel deposits to bridge over between said initial metallic nickel deposits to form a continuous electroless nickel coating on said article, which coating has a thickness of at least about 5 microns.

7. A method for the electroless nickel coating of an article comprising, on the surface of said article, a cured epoxy resin matrix containing generally minus 60 mesh metal filler particles uniformly distributed through said matrix, said article being selected from the group consisting of foundry patterns and core boxes, which method comprises:
   (a) impinging the surface of a said article with inert particles, having a Moh's scale hardness in excess of 4.5 and a U.S. Standard mesh size such that a major amount by weight of said particles will pass a 60 mesh screen, thereby increasing the number of metal filler particles at the surface of said article which are exposed to the atmosphere and free of any coating of or encapsulation with cured resin;
   (b) removing any metal oxide film on the exposed surfaces of the exposed metal filler particles by contacting said exposed surfaces with nitric acid for a period of time, less than about 1 minute, sufficient to remove said metal oxide film but insufficient to oxidatively attack said cured epoxy resin matrix; and
   (c) immersing the said article treated according to steps (a) and (b) in an electroless nickel plating bath maintained at a temperature ranging from about 160° to 210° F., said immersing being carried out after said step (b) without any intermediate steps involving oxidation of the surface of the resin matrix and catalytic treatment for activation of the resin surface and the metal filler particles, whereby said steps (a) and (b) are essentially the steps for providing sites for electroless nickel deposition, and plating the said article treated according to steps (a) and (b), while in said electroless nickel plating bath, until initial metallic nickel deposits form on the oxide-free surfaces of said exposed metal filler particles and sufficient additional metallic nickel deposits to bridge over between said initial metallic nickel deposits to form a continuous electroless nickel coating on said article, which coating has a thickness of at least about 5 microns.

* * * * *